(12) United States Patent
Ni et al.

(10) Patent No.: US 7,786,744 B2
(45) Date of Patent: Aug. 31, 2010

(54) PROBE CARD ASSEMBLY AND TEST PROBES THEREIN

(75) Inventors: Cheng-Chin Ni, Hsin-Chu (TW); Kun-Chou Chen, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 148 days.

(21) Appl. No.: 12/338,037

(22) Filed: Dec. 18, 2008

(65) Prior Publication Data

US 2010/0109689 A1 May 6, 2010

(30) Foreign Application Priority Data

Nov. 4, 2008 (TW) .............................. 097142442

(51) Int. Cl.
*G01R 31/02* (2006.01)
(52) U.S. Cl. ..................................... 324/754
(58) Field of Classification Search ........... None
See application file for complete search history.

(56) References Cited

U.S. PATENT DOCUMENTS

| | | | |
|---|---|---|---|
| 3,654,585 A | 4/1972 | Wickersham |
| 3,982,807 A | 9/1976 | Anhalt et al. |
| 3,984,620 A | 10/1976 | Robillard et al. |
| 4,176,900 A | 12/1979 | Hines et al. |
| 4,266,839 A | 5/1981 | Aikens |
| 4,518,914 A | 5/1985 | Okubo et al. |
| 4,523,144 A | 6/1985 | Okubo et al. |
| 4,567,433 A | 1/1986 | Ohkubo et al. |
| 4,591,217 A | 5/1986 | Reimer |
| 4,684,194 A | 8/1987 | Jenkins et al. |
| 4,719,417 A | 1/1988 | Evans |
| 4,837,622 A | 6/1989 | Whann et al. |
| 4,899,099 A | 2/1990 | Mendenhall et al. |
| 4,932,883 A | 6/1990 | Hsia et al. |
| 5,134,365 A | 7/1992 | Okubo et al. |
| 5,172,050 A | 12/1992 | Swapp |
| 5,225,037 A | 7/1993 | Elder et al. |
| 5,382,898 A | 1/1995 | Subramanian |
| 5,475,317 A | 12/1995 | Smith |
| 5,604,446 A | 2/1997 | Sano |
| 5,625,298 A | 4/1997 | Hirano et al. |
| 5,670,889 A | 9/1997 | Okubo et al. |
| 5,742,174 A | 4/1998 | Kister et al. |
| 5,773,987 A | 6/1998 | Montoya |
| 5,829,126 A | 11/1998 | Nagao et al. |
| 6,137,297 A | 10/2000 | McNair et al. |
| 6,184,698 B1 | 2/2001 | Yoshida et al. |
| 6,478,596 B2 | 11/2002 | Yoshida et al. |

(Continued)

*Primary Examiner*—Jermele M Hollington
(74) *Attorney, Agent, or Firm*—Ming Chow; Sinorica, LLC

(57) ABSTRACT

Discloses are a probe card assembly and test probes used therein. The probe card assembly includes a main body, a probe base disposed in a central portion of the main body and a plurality of test probes connected between the probe base and the main body. Each of the test probes has a tip extending from the probe base for contacting a wafer under test. The test probes include at least one power probe, at least one signal probe and a plurality of ground probes. Each of the test probes has a middle section interposed between the main body and the probe base. Each of the test probes except the ground probes has a naked middle section coated with an insulating film but not sheltered by an insulating sleeve.

12 Claims, 4 Drawing Sheets

U.S. PATENT DOCUMENTS

| | | |
|---|---|---|
| 6,515,358 B1 | 2/2003 | Dass et al. |
| 7,053,638 B2 | 5/2006 | Hsu et al. |
| 7,271,603 B2 | 9/2007 | Gleason et al. |
| 7,304,488 B2 | 12/2007 | Gleason et al. |
| 7,629,803 B1* | 12/2009 | Ni .............................. 324/754 |
| 7,710,134 B2* | 5/2010 | Ni .............................. 324/754 |
| 2009/0315576 A1* | 12/2009 | Ni .............................. 324/754 |
| 2009/0315577 A1* | 12/2009 | Ni .............................. 324/754 |
| 2010/0052710 A1* | 3/2010 | Ni .............................. 324/754 |

* cited by examiner

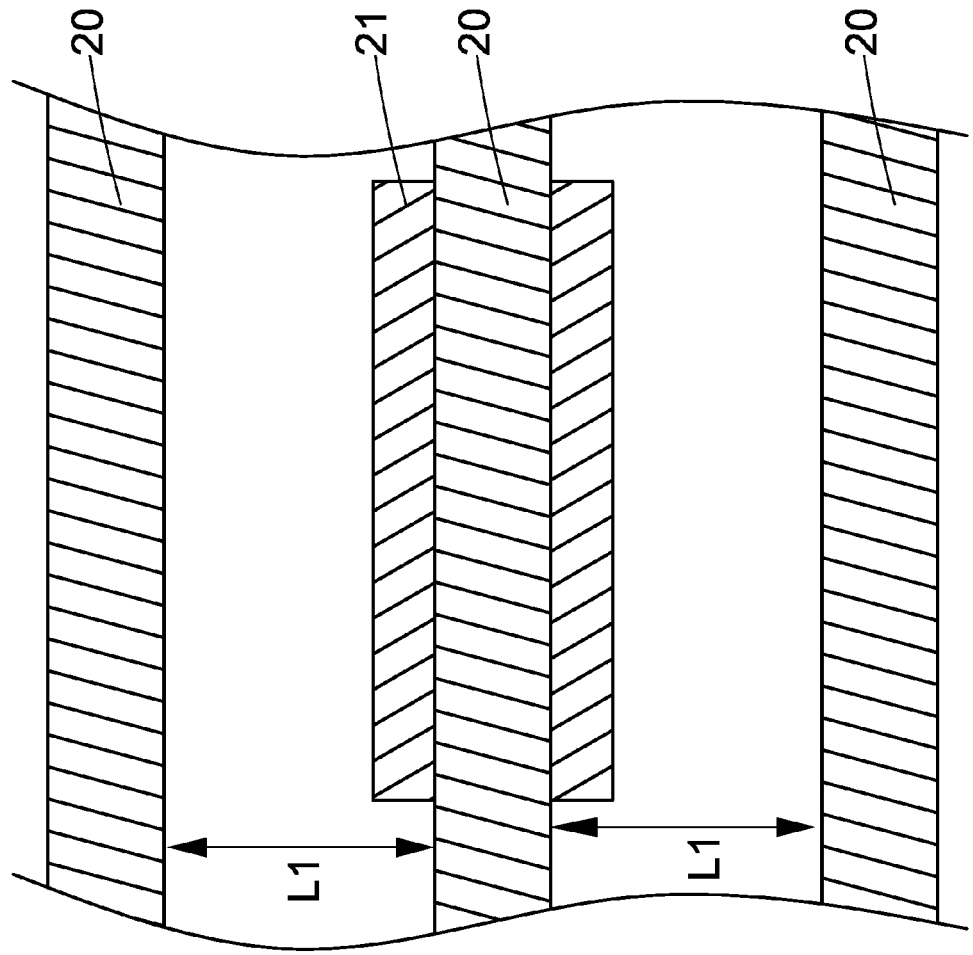

PROBE CARD ASSEMBLY AND TEST PROBES THEREIN

BACKGROUND OF THE INVENTION

1. Technical Field

The present invention relates to a probe card assembly and test probes used therein. More particularly, the present invention relates to a probe card assembly and test probes therein for testing semiconductor wafers.

2. Description of Related Art

In a process for manufacturing semiconductor wafers, test equipments and probe cards are typically used for testing dies on the wafers. Some prior arts, such as U.S. Pat. Nos. 7,053,638, 6,515,358, 6,137,297, 5,670,889, 7,271,603, 7,304,488 and 6,478,596, have proposed related approaches. A probe card has precise contacting means for contacting and electrifying each die on a wafer so as to test the dies and thereby ensure that the wafer is fabricated with electrical properties and performances answering to its design specifications. In order to cater for the recently prevalent high-speed operation of semiconductor apparatuses, it is important that signal transmission between a testing machine and a probe card be free from distortion of high-frequency signals. Please refer to FIG. 1A that graphically illustrates a conventional probe card 30 having a plurality of test probes 20 and FIG. 1B that further provides an enlarged sectional view of the test probes 20 in an area A of FIG. 1A. As can be seen from these drawings, each of the test probes is independently sheltered by an insulating sleeve 21 that possesses a substantial thickness and thus even if the test probes 20 are closely arranged, an interval L1 exits between two adjacent test probes 20, thereby substantially limiting the density of arrangement of the test probes 20. In consideration of the fact that such probe card 30 currently still depends on manual operation to arrange the test probes 20 thereon and then install the insulating sleeves 21, the intervals L1 being narrow can bring difficulty to the assembling process of the probe card 30. On the other hand, the fact that resistance between the test probes 20 is in direct proportion to length of the interval L1 suggests that the thickness of the insulating sleeves 21, which contributes to the interval L1, can adversely affect signal transmission during high-frequency testing, which is critical in mass manufacture of wafers. Hence, a need exists for a structural improvement in the traditional probe card to remedy the problem of the prior arts without adding difficulty to manufacture.

SUMMARY OF THE INVENTION

In an attempt to overcome the defects of the prior arts, the present invention provides a probe card assembly and test probes therein. The probe card assembly comprises a main body, a probe base disposed in a central portion of the main body and a plurality of test probes connected between the probe base and the main body. Each of the test probes has a tip extending from the probe base for contacting a wafer under test. The test probes comprise at least one power probe, at least one signal probe and a plurality of ground probes. Each of the test probes has a middle section interposed between the main body and the probe base. Each of the test probes except the ground probes has a naked middle section coated with an insulating film but not sheltered by an insulating sleeve.

Thus, a main objective of the present invention is to provide a probe card assembly and test probes therein for high-frequency testing of wafers, wherein an insulating film is coated onto a power probe or a signal probe, both being part of the test probes, so as to reduce intervals between the test probes and in turn decrease impedance.

Another objective of the present invention is to provide a probe card assembly and test probes therein for high-frequency testing of wafers, wherein an insulating film is coated onto a power probe or a signal probe, both being part of the test probes, so as to improve accuracy in the high-frequency testing.

A further objective of the present invention is to provide a probe card assembly and test probes therein for high-frequency testing of wafers, wherein the probe card assembly is adaptive to mass manufacture.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein:

FIG. 1B is a partially enlarged view of an area A in FIG. 1A, showing conventional test probes;

DETAILED DESCRIPTION OF THE PREFERRED EMBODIMENTS

The present invention provides a probe card assembly and test probes therein for probing a wafer. Since the operational principles and basic functions of probe cards and test probes are well known to people of ordinary skill in the art, a detailed description of such principles and functions will be omitted herein. Meantime, the accompanying drawings to which the following description refers are intended to illustrate structural features of the present invention only schematically and therefore are not, and need not be, drawn to scale.

Figure 2A:
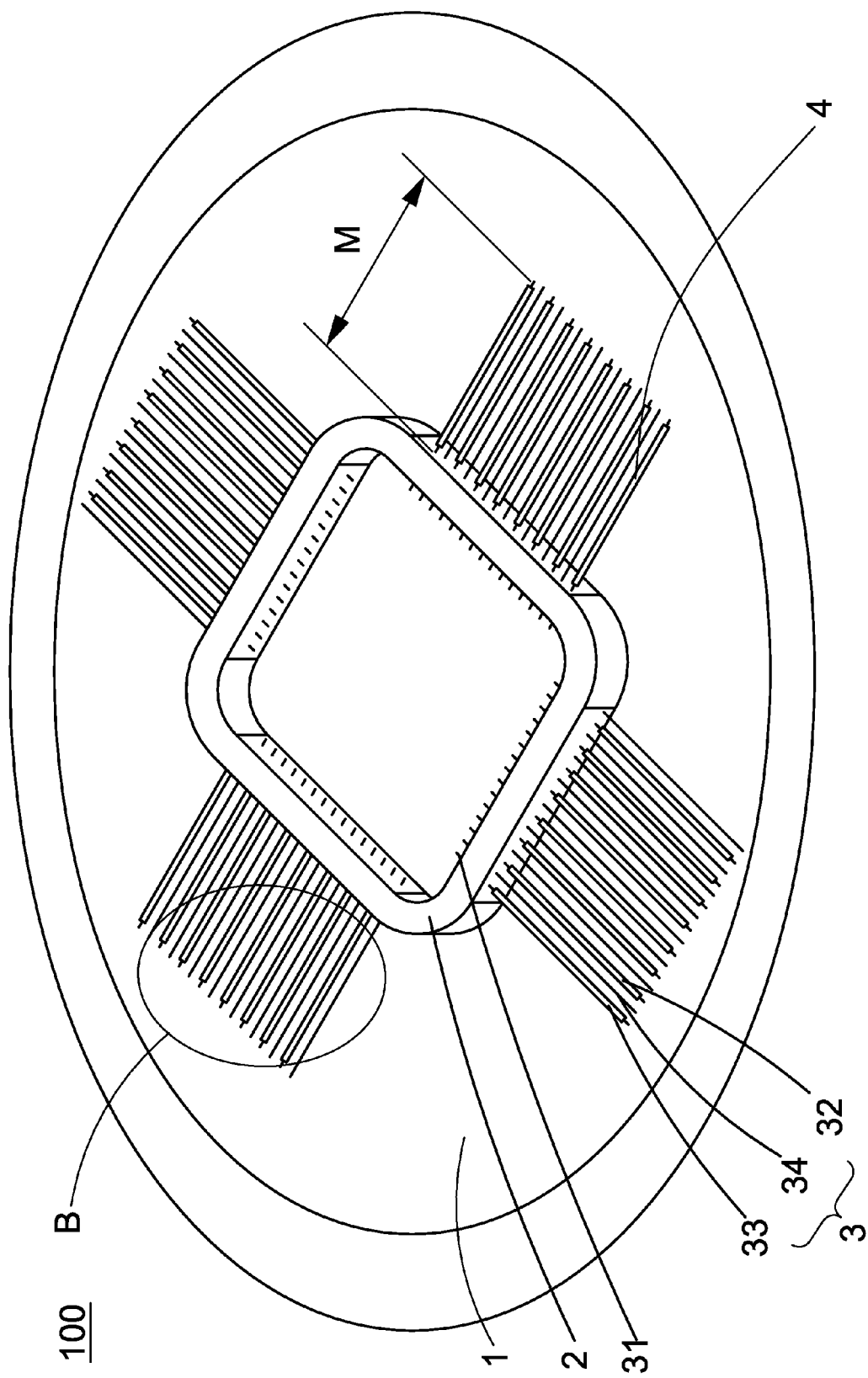
FIG. 2A is a schematic drawing showing a probe card assembly according to a first or a second preferred embodiment of the present invention.

Please refer to FIG. 2A for a first preferred embodiment of the present invention, namely, a probe card assembly 100. Therein, the probe card assembly 100 comprises a main body 1, a probe base 2 disposed in a central portion of the main body 1 and a plurality of test probes 3 connected between the main body 1 and the probe base 2. The test probes 3 comprise at least one power probe 32, at least one signal probe 33 and a plurality of ground probes 34. Each of the test probes 3 has a middle section M interposed between the main body 1 and the probe base 2. Beside, each of the test probes 3 has a tip 31 extending from the probe base 2 for contacting a wafer (not shown) under test during high-frequency testing.

Figure 1A:
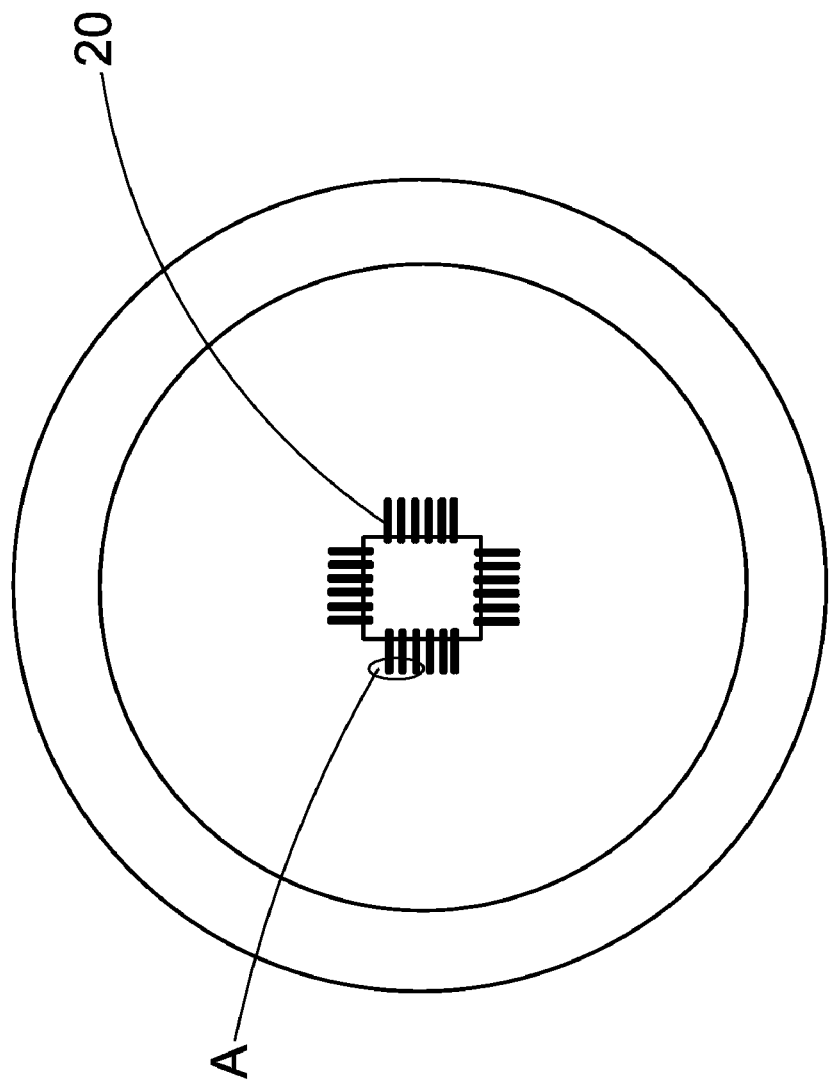
FIG. 1A is a schematic drawing showing a conventional probe card.
Figure 2B:
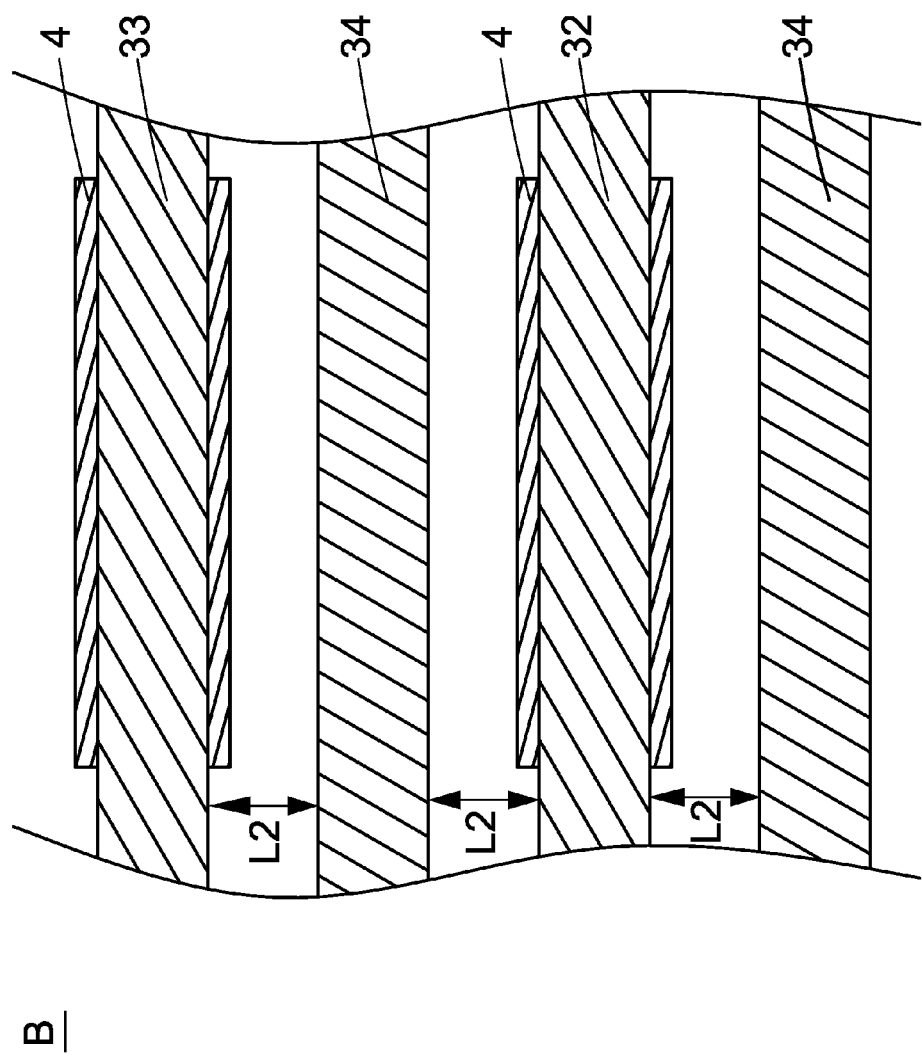
FIG. 2B is a partially enlarged view of an area B in FIG. 2A, showing test probes according to the first or the second preferred embodiment of the present invention.

FIG. 2B is an enlarged sectional view of the test probes 3 in an area B of FIG. 2A. The middle section M of each said test probe 3 is naked without being sheltered by any insulating sleeve. According to a preferred embodiment of the present invention, all the test probes 3 except the ground probes 34, namely the power probe 32 and the signal probe 33, have their middle sections M respectively coated with an insulating film 4 through an anodic treatment, wherein the solution used can be a boric acid anodizing electrolyte, citrates or tastrates. In contrast to the conventional probe card 30 shown in FIG. 1A that requires a relatively complex manufacturing process in which manual operation is relied upon to arrange the test probes 20 on the probe card 30 and then install the insulating sleeves 21 on the test probes 20, the present invention is advantageous in that the insulating film 4 formed through the anodic treatment is superior in insulation and heat resistance while being adaptive to mass manufacture. By using the insulating film 4, manual operation for installing the conventional insulating sleeves 21 (as shown in FIG. 1B) can be dispensed with, and therefore the probe card 100 is easy to fabricate. It is to be noted that, since the insulating film 4 is very thin in thickness, or in the micron scale to be exact, the test probes 3 are allowed to be arranged in maximized closeness. Referring to FIGS. 2A and 2B again, the test probes 3 are slightly separated by tiny intervals L2. Thus, in signal transmission, the conduction path is shortened and the signal loop is contracted. As a result, characteristic impedance is effectively lowered to in turn permit the signal probe 33 to transmit high-frequency signals with enhanced efficiency and reduced signal distortion, thereby accomplishing the desired high-frequency testing.

A second preferred embodiment of the present invention is further provided herein, namely test probes 3 used in a probe card assembly 100. Also referring to FIGS. 2A and 2B, the probe card assembly 100 comprises a main body 1, a probe base 2 disposed in a central portion of the main body 1 and a plurality of the test probes 3 connected between the main body 1 and the probe base 2. Each of the test probes 3 has a middle section M interposed between the main body 1 and the probe base 2. Beside, each of the test probes 3 has a tip 31 extending from the probe base 2 for contacting a wafer (not shown) under test during high-frequency testing. The middle section M of each said test probe 3 is naked without being sheltered by any insulating sleeve. Instead, the middle sections M are respectively coated with an insulating film 4 through anodic treatment. Other characteristics of the test probes 3 are identical to those described in the first preferred embodiment.

The present invention has been described with reference to preferred embodiments thereof and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A probe card assembly, comprising a main body, a probe base disposed in a central portion of the main body and a plurality of test probes connected between the probe base and the main body, wherein each said test probe has a tip extending from the probe base for contacting a wafer under test, and the test probes comprise at least one power probe, at least one signal probe and a plurality of ground probes, each said test probe having a middle section interposed between the main body and the probe base, the probe card assembly being characterized in that:

each of the test probes except the ground probes has its naked middle section coated with an insulating film.

2. The probe card assembly of claim 1, wherein the insulating film is formed through an anodic treatment.

3. The probe card assembly of claim 2, wherein the anodic treatment uses a solution selected from the group consisting of a boric acid anodizing electrolyte, citrates and tastrates.

4. The probe card assembly of claim 1, wherein the test probe having its naked middle section coated with the insulating film is the power probe.

5. The probe card assembly of claim 1, wherein the test probe having its naked middle section coated with the insulating film is the signal probe.

6. The probe card assembly of claim 1, wherein the middle section of each said ground probe is left naked without being coated with any insulating film.

7. Test probes for use in a probe card assembly, wherein the probe card assembly comprises a main body, a probe base disposed in a central portion of the main body and a plurality of said test probes connected between the probe base and the main body, each said test probe having a tip extending from the probe base for contacting a wafer under test, and the test probes comprising at least one power probe, at least one signal probe and a plurality of ground probes, in which each said test probe has a middle section interposed between the main body and the probe base, the test probes being characterized in that:

each of the test probes except the ground probes has its naked middle section coated with an insulating film.

8. The test probes of claim 7, wherein the insulating film is formed through an anodic treatment.

9. The test probes of claim 8, wherein the anodic treatment uses a solution selected from the group consisting of a boric acid anodizing electrolyte, citrates and tastrates.

10. The test probes of claim 7, wherein the test probe having its naked middle section coated with the insulating film is the power probe.

11. The test probes of claim 7, wherein the test probe having its naked middle section coated with the insulating film is the signal probe.

12. The test probes of claim 7, wherein the middle section of each said ground probe is left naked without being coated with any insulating film.

* * * * *